US 11,373,782 B2

(12) United States Patent
Sorenson et al.

(10) Patent No.: US 11,373,782 B2
(45) Date of Patent: Jun. 28, 2022

(54) INDICATOR ACTIVATION OVER AN ALTERNATIVE CABLE PATH

(71) Applicant: International Business Machines Corporation, Armonk, NY (US)

(72) Inventors: Todd C. Sorenson, Tucson, AZ (US);
Gary W. Batchelor, Tucson, AZ (US);
Ya-Huey Juan, San Jose, CA (US);
Seamus Burke, Tucson, AZ (US);
Maoyun Tang, Chandler, AZ (US);
Trung N. Nguyen, Vail, AZ (US)

(73) Assignee: International Business Machines Corporation, Armonk, NY (US)

( * ) Notice: Subject to any disclaimer, the term of this patent is extended or adjusted under 35 U.S.C. 154(b) by 539 days.

(21) Appl. No.: 16/558,253

(22) Filed: Sep. 2, 2019

(65) Prior Publication Data

US 2021/0063651 A1 Mar. 4, 2021

(51) Int. Cl.
*G06F 11/00* (2006.01)
*H01B 7/32* (2006.01)
*H05K 7/14* (2006.01)
*G02B 6/38* (2006.01)

(52) U.S. Cl.
CPC ............ *H01B 7/32* (2013.01); *H05K 7/1447* (2013.01); *H05K 7/1491* (2013.01); *H05K 7/1498* (2013.01); *G02B 6/3895* (2013.01)

(58) Field of Classification Search
CPC ...... H01B 7/32; H05K 7/1447; H05K 7/1491; H05K 7/1498; G02B 6/3895; G02B 6/447
USPC .......................................................... 714/43
See application file for complete search history.

(56) References Cited

U.S. PATENT DOCUMENTS

| 6,243,305 | B1 * | 6/2001 | Brady ................. G11C 29/78 365/240 |
| 8,966,210 | B2 | 2/2015 | Myrah et al. |
| 9,164,862 | B2 | 10/2015 | Paul et al. |
| 9,703,744 | B2 | 7/2017 | Tanaka et al. |
| 9,740,409 | B2 | 8/2017 | Kanigicherla et al. |
| 2018/0286200 | A1 * | 10/2018 | Gordon ............ G08B 13/19656 |

(Continued)

OTHER PUBLICATIONS

Anonymously, "Link recovery using lane merging in PCIe cable attached 10 sub systems," IP.com Publication No. PCOM000243768D, Oct. 16, 2015.

(Continued)

*Primary Examiner* — Don N Vo
(74) *Attorney, Agent, or Firm* — Nelson IP; Daniel P. Nelson (57) ABSTRACT

A method is disclosed to identify a port that is associated with a faulty cable. In one embodiment, such a method identifies a cable to replace. The cable provides a path between a first port, residing on a first component, and a second port, residing on a second component. The method further identifies whether an alternative path, bypassing the first cable, exists between the first component and the second component. In the event the alternative path exists, the method sends, over the alternative path, from the first component to the second component, a command to activate an indicator on the second port. This command is received and executed by the second component to activate the indicator. A corresponding apparatus and computer program product are also disclosed.

20 Claims, 8 Drawing Sheets

(56) References Cited

U.S. PATENT DOCUMENTS

2021/0012817 A1* 1/2021 Laurent ............... G11C 7/1069

OTHER PUBLICATIONS

Anonymously, "Visual Indication of Cable Quality," IP.com Publication No. IPCOM000220221D, Jul. 25, 2012.
IBM, "Cable with integrated fault detection," IP.com Publication No. IPCOM000140584D, Sep. 14, 2006.
IBM, "Method and Apparatus for Diagnostics of Complex Cable Systems using Embedded Light," IP.com Publication No. IPCOM000170610D, May 22, 2008.
"SAS RAID Cards, ARC-1680 Series, PCIe to SAS RAID Controllers," User's Manual, Version 1.4, Aug. 2009.
Racherla, et al., "IBM System Storage DS4000 and Storage Manager V10.30," IBM Redbooks, Mar. 2009.

* cited by examiner

INDICATOR ACTIVATION OVER AN ALTERNATIVE CABLE PATH

BACKGROUND

Field of the Invention

This invention relates to apparatus and methods for activating indicators associated with ports to which a cable is connected.

Background of the Invention

In complex rack-mounted or other systems (e.g., storage arrays, audio-visual systems, mainframe servers, etc.) that include multiple discrete electronic components that are connected to one another, the components are often connected together using external cables. These cables may be connected to ports on the components to enable communication and/or power signals to pass therebetween. The cables represent a critical part of the system infrastructure. If cables do not operate properly, the complex system is unlikely to function as well as it could, and may not function at all. For this reason, cabling systems, such as structured cabling, have been developed to minimize mistakes that may impair the operation of a complex system.

When a cable fails or communication is broken, indicators such as light-emitting diode (i.e., LED) lights may be activated on ports to which the cable is connected, thereby indicating that the cable needs to be replaced and/or repaired. This may enable a technician to quickly identify the faulty cable and/or the ports to which it is connected. However, in certain cases, activating indicators on ports that reside at both ends of the cable may require communicating with the ports over the cable. Because the cable has failed or communication has been interrupted, such communication may not be possible. As a result, one or more indicators may not be activated. This may make it more difficult to identify the faulty cable and/or the ports to which it is connected. This, in turn, may slow down the process of replacing and/or repairing faulty cables.

In view of the foregoing, what are needed are apparatus and methods to activate indicators on both ports to which a cable is connected, particularly when the cable fails or communication is broken. Ideally, such apparatus and methods will enable a technician to quickly identify the faulty cable and/or the ports to which it is connected.

SUMMARY

The invention has been developed in response to the present state of the art and, in particular, in response to the problems and needs in the art that have not yet been fully solved by currently available apparatus and methods. Accordingly, embodiments of the invention have been developed to identify ports that are connected to faulty cables. The features and advantages of the invention will become more fully apparent from the following description and appended claims, or may be learned by practice of the invention as set forth hereinafter.

Consistent with the foregoing, a method is disclosed to identify a port that is associated with a faulty cable. In one embodiment, such a method identifies a cable to replace. The cable provides a path between a first port, residing on a first component, and a second port, residing on a second component. The method further identifies whether an alternative path, bypassing the first cable, exists between the first component and the second component. In the event the alternative path exists, the method sends, over the alternative path, from the first component to the second component, a command to activate an indicator on the second port. This command is received and executed by the second component to activate the indicator.

A corresponding apparatus and computer program product are also disclosed and claimed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The present invention may be embodied as a system, method, and/or computer program product. The computer program product may include a computer-readable storage medium (or media) having computer-readable program instructions thereon for causing a processor to carry out aspects of the present invention.

The computer-readable storage medium may be a tangible device that can retain and store instructions for use by an instruction execution device. The computer-readable storage medium may be, for example, but is not limited to, an electronic storage system, a magnetic storage system, an optical storage system, an electromagnetic storage system, a semiconductor storage system, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage system via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The computer-readable program instructions may execute entirely on a user's computer, partly on a user's computer, as a stand-alone software package, partly on a user's computer and partly on a remote computer, or entirely on a remote computer or server. In the latter scenario, a remote computer may be connected to a user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present invention.

Aspects of the present invention may be described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, may be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus, or other device to produce a computer-implemented process, such that the instructions which execute on the computer, other programmable apparatus, or other device implement the functions/acts specified in the flowchart and/or block diagram block or blocks.

Figure 1:
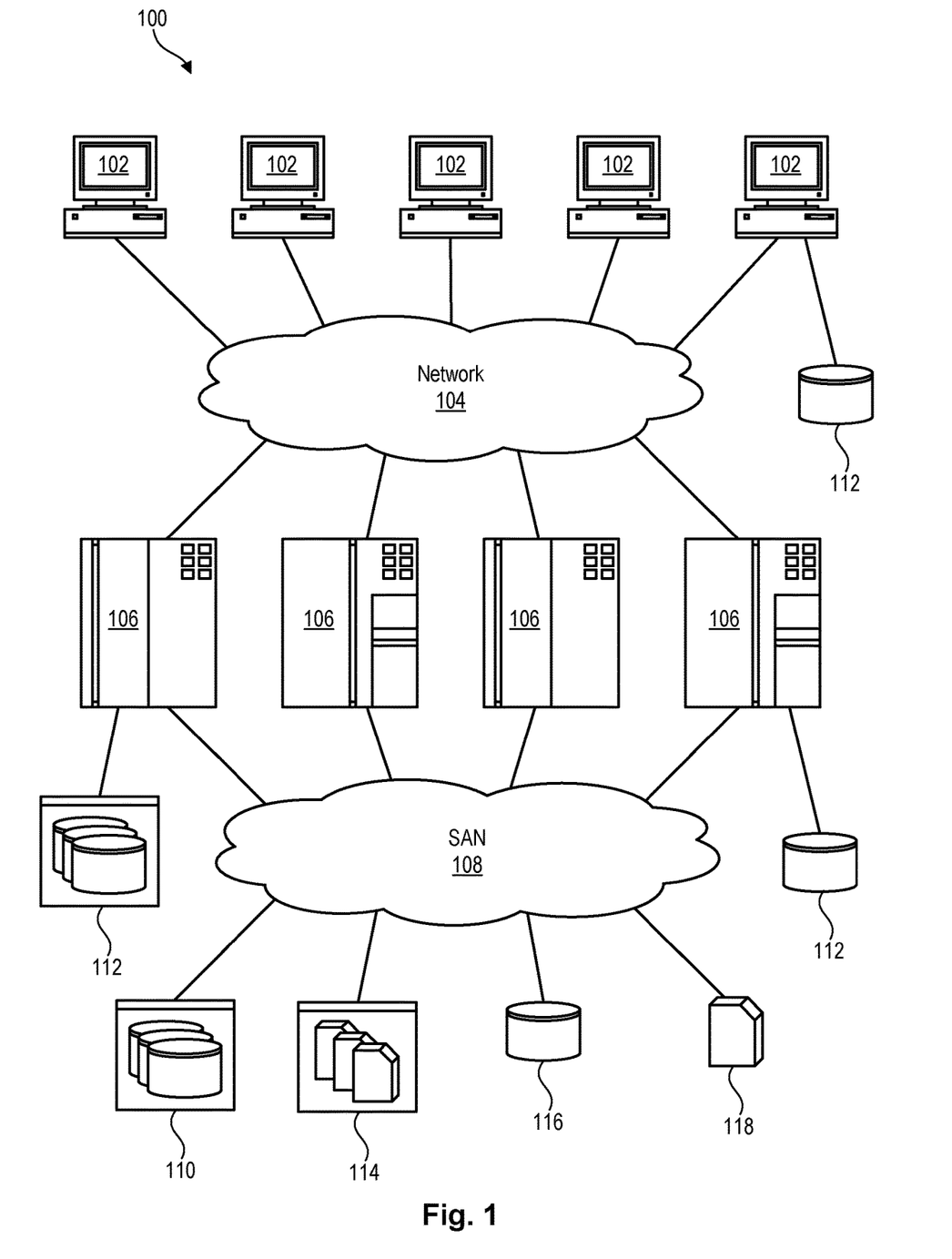
FIG. 1 is a high-level block diagram showing one example of a network environment in which apparatus and methods in accordance with the invention may be implemented.

Referring to FIG. 1, one example of a network environment 100 is illustrated. The network environment 100 is presented to show one example of an environment where apparatus and methods in accordance with the invention may be utilized. The network environment 100 is presented by way of example and not limitation. Indeed, the apparatus and methods disclosed herein may be applicable to a wide variety of different network environments in addition to the network environment 100 shown.

As shown, the network environment 100 includes one or more computers 102, 106 interconnected by a network 104. The network 104 may include, for example, a local-area-network (LAN) 104, a wide-area-network (WAN) 104, the Internet 104, an intranet 104, or the like. In certain embodiments, the computers 102, 106 may include both client computers 102 and server computers 106 (also referred to herein as host systems 106). In general, the client computers 102 initiate communication sessions, whereas the server computers 106 wait for and respond to requests from the client computers 102. In certain embodiments, the computers 102 and/or servers 106 may connect to one or more internal or external direct-attached storage systems 112 (e.g., arrays of hard-storage drives, solid-state drives, tape drives, etc.). These computers 102, 106 and direct-attached storage systems 112 may communicate using protocols such as ATA, SATA, SCSI, SAS, Fibre Channel, or the like.

The network environment 100 may, in certain embodiments, include a storage network 108 behind the servers 106, such as a storage-area-network (SAN) 108 or a LAN 108 (e.g., when using network-attached storage). This network 108 may connect the servers 106 to one or more storage systems, such as arrays 110 of hard-disk drives or solid-state drives, tape libraries 114, individual hard-disk drives 116 or solid-state drives 116, tape drives 118, CD-ROM libraries, or the like. To access a storage system 110, 114, 116, 118, a host system 106 may communicate over physical connections from one or more ports on the host system 106 to one or more ports on the storage system 110, 114, 116, 118. A connection may be through a switch, fabric, direct connection, or the like. In certain embodiments, the servers 106 and storage systems 110, 114, 116, 118 may communicate using a networking standard or protocol such as Fibre Channel (FC) or iSCSI.

Figure 2:
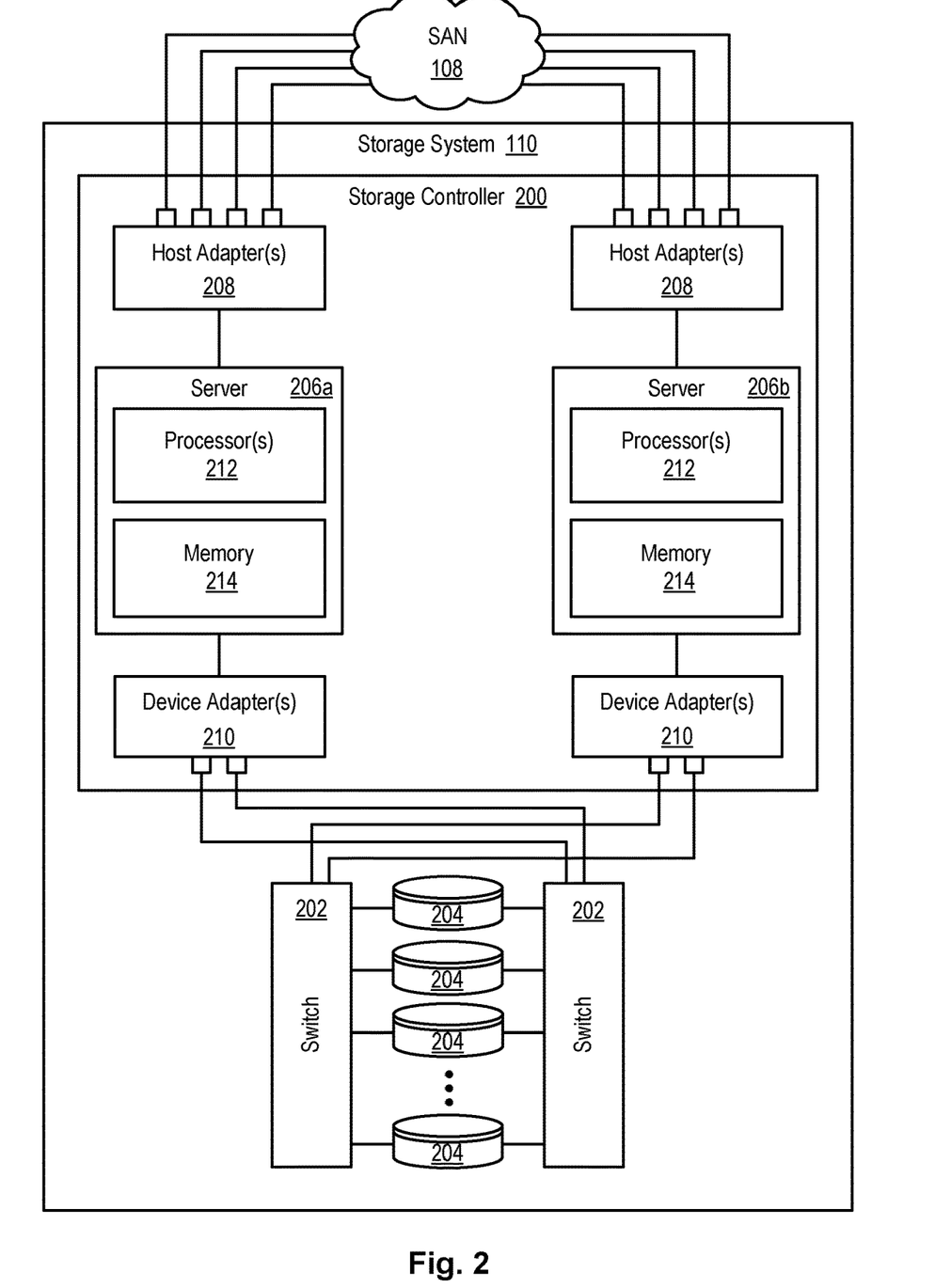
FIG. 2 is a high-level block diagram showing one embodiment of a storage system for use in the network environment of FIG. 1.

Referring to FIG. 2, one example of a storage system 110 containing an array of hard-disk drives 204 and/or solid-state drives 204 is illustrated. As shown, the storage system 110 includes a storage controller 200, one or more switches 202, and one or more storage drives 204, such as hard-disk drives 204 and/or solid-state drives 204 (e.g., flash-memory-based drives 204). The storage controller 200 may enable one or more host systems 106 (e.g., open system and/or mainframe servers 106 running operating systems such z/OS, zVM, or the like) to access data in the one or more storage drives 204.

In selected embodiments, the storage controller 200 includes one or more servers 206a, 206b. The storage controller 200 may also include host adapters 208 and device adapters 210 to connect the storage controller 200 to host devices 106 and storage drives 204, respectively. Multiple servers 206a, 206b may provide redundancy to ensure that data is always available to connected host systems 106. Thus, when one server 206a fails, the other server 206b may pick up the I/O load of the failed server 206a to ensure that I/O is able to continue between the host systems 106 and the storage drives 204. This process may be referred to as a "failover."

In selected embodiments, each server 206 includes one or more processors 212 and memory 214. The memory 214 may include volatile memory (e.g., RAM) as well as non-volatile memory (e.g., ROM, EPROM, EEPROM, hard disks, flash memory, etc.). The volatile and non-volatile memory may, in certain embodiments, store software modules that run on the processor(s) 212 and are used to access data in the storage drives 204. These software modules may manage all read and write requests to logical volumes in the storage drives 204.

One example of a storage system 110 having an architecture similar to that illustrated in FIG. 2 is the IBM DS8000™ enterprise storage system. The DS8000™ is a high-performance, high-capacity storage controller providing disk and solid-state storage that is designed to support continuous operations. Nevertheless, the techniques disclosed herein are not limited to the IBM DS8000™ enterprise storage system 110, but may be implemented in any comparable or analogous storage system 110, regardless of the manufacturer, product name, or components or component names associated with the system 110. Any storage system that could benefit from one or more embodiments of the invention is deemed to fall within the scope of the invention. Thus, the IBM DS8000™ is presented only by way of example and not limitation.

Figure 3:
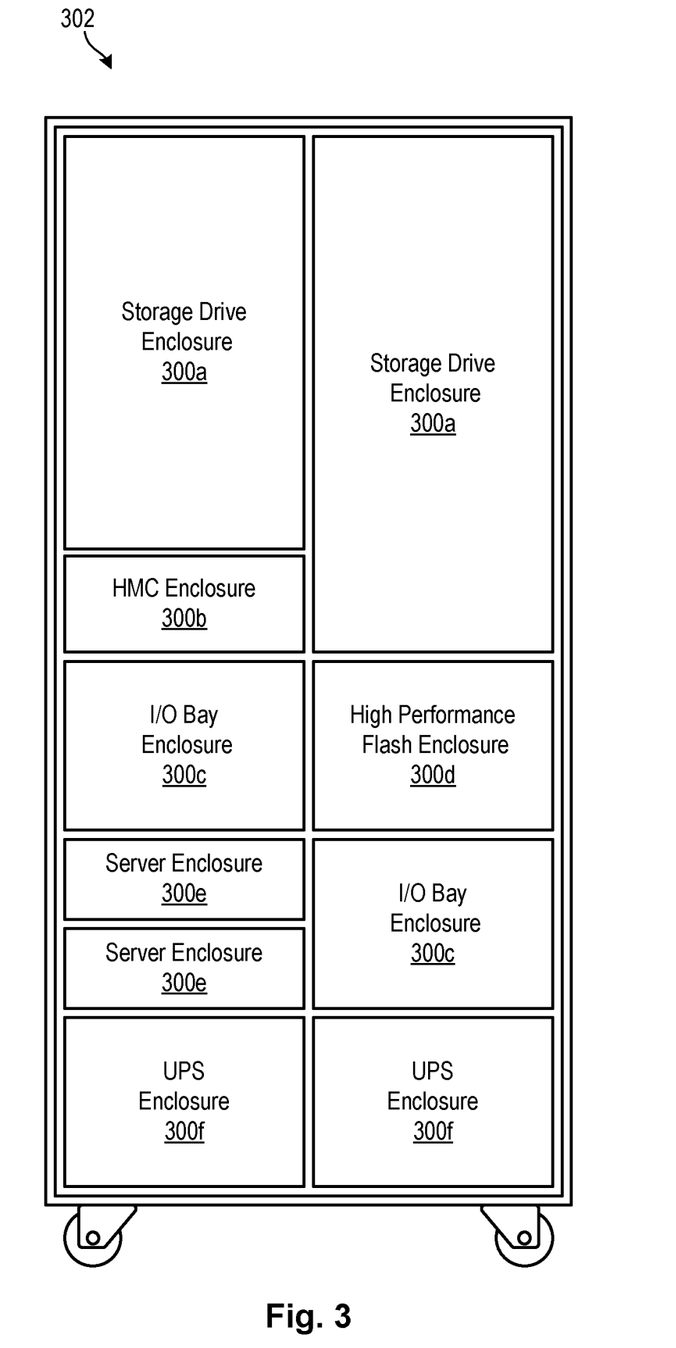
FIG. 3 is a high-level block diagram showing components of a storage system, such as the storage system illustrated in FIG. 2, contained within a rack.

Referring to FIG. 3, in certain embodiments, the components of a storage system 110, such as that illustrated in FIG. 2, may be contained in various enclosures 300 mounted, for example, within a rack 302. For example, the storage drives 204 may be contained within storage drive enclosures 300a, the host adapters 208 and/or device adapters 210 may be contained within I/O bay enclosures 300c, the servers 206a, 206b may be contained within server enclosures 300e, and so forth. In the illustrated embodiment, the rack 302 may also include an enclosure 300b that contains a hardware management console (HMC), enclosures 300f that contain uninterruptible power supplies (UPSs), and an enclosure 300d that contains high performance flash memory. These enclosures 300 are simply provided by way of example and not limitation. Other types of enclosures 300 are possible and within the scope of the invention.

In rack-mounted systems such as that illustrated in FIG. 3 that include multiple electronic components (e.g., host adapters 208, servers 206, device adapters, 210, switches 202, storage drives 204, etc.) that are connected to one another, the components may be connected together using external cables. These cables may be connected to ports on the components to enable communication and/or power signals to pass therebetween. The cables represent a critical part of the system infrastructure. If cables are not installed properly, the system is unlikely to function as well as it could, and may not function at all. For this reason, cabling systems, such as structured cabling, have been developed to minimize mistakes that may impair the operation of such a system.

When a cable fails or communication is broken, indicators such as light-emitting diode (i.e., LED) lights may be activated on ports to which the cable is connected, thereby indicating that the cable needs to be replaced and/or repaired. This may enable a technician to quickly identify the faulty cable and/or the ports to which it is connected. However, in certain cases, activating an indicator on ports that reside at both ends of the cable may require communicating with the ports over the cable. Because the cable has failed or communication has been interrupted, such communication may not be possible. As a result, one or more indicators may not be activated. This may make it more difficult to identify the faulty cable and/or the ports to which it is connected. This, in turn, may slow down the process of replacing and/or repairing faulty cables. Thus, apparatus and methods are needed to activate indicators on both ports to which a cable is connected, particularly when the cable fails or communication is interrupted. Ideally, such apparatus and methods will enable a technician to quickly identify the faulty cable and/or the ports to which it is connected.

Figure 4:
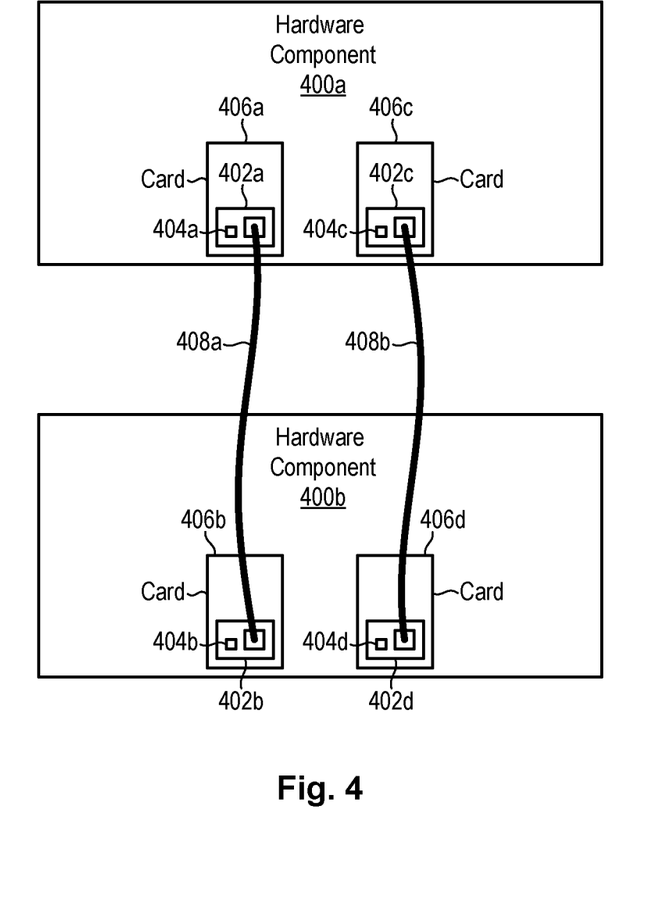
FIG. 4 is a high-level block diagram showing cables extending between ports of a pair of components.

FIG. 4 shows a pair of generic components 400a, 400b coupled together with cables 408a, 408b. The components 400a, 400b may be any of the components, enclosures, or devices illustrated in FIG. 2 or 3, for example. As shown, the components 400a, 400b may include multiple ports 402 for communicating with other components. In the illustrated example, a cable 408a connects the port 402a to the port 402b, and a cable 408b connects the port 402c to the port 402d. Each of the ports 402 may include an indicator 404 (e.g., a light-emitting diode, or LED) to identify the ports 402 and associated cable 408 in the event the cable 408 becomes faulty or needs to be identified.

In certain embodiments, the ports 402 may be provided on cards 406 (e.g., PCI cards) that are installed on the components 400a, 400b, although this is not necessary in all embodiments. In other embodiments, the ports 402 are permanently integrated into their respective components 400a, 400b. Furthermore, the ports 402 of a component 400 may reside on the same or different cards 406.

Figure 5:
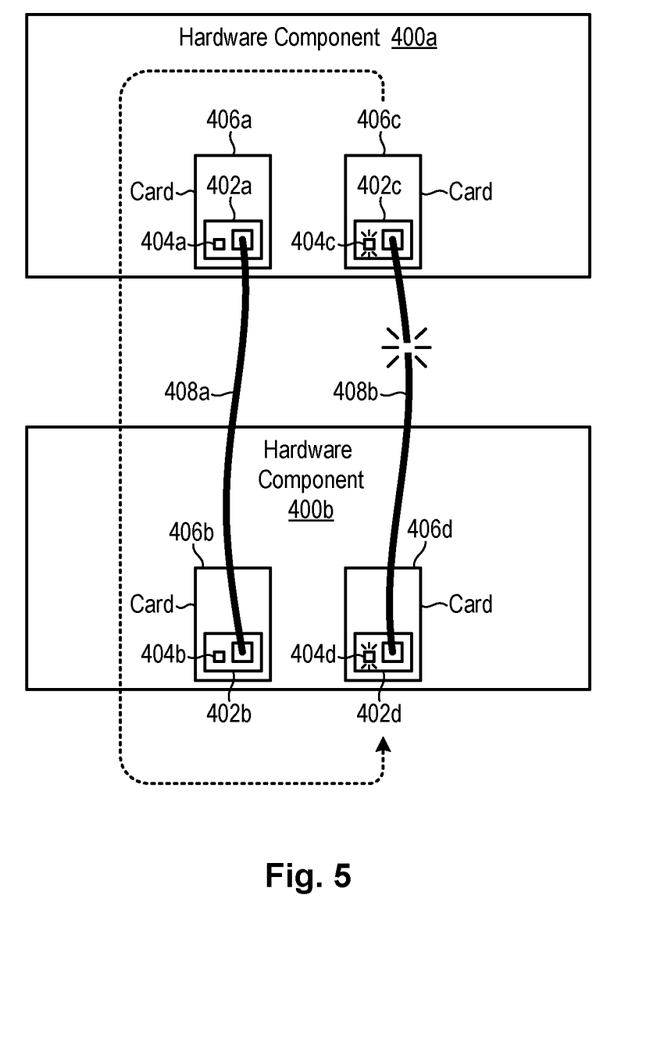
FIG. 5 is a high-level block diagram showing a faulty cable, as well as communication flowing through an alternative path (i.e., another good cable) to activate a identifier on a remote port connected to the faulty cable.

Referring to FIG. 5, when a cable 408 fails or communication is interrupted across the cable 408, the indicators 404 at each end of the cable 408 may ideally be activated to identify the cable 408 that needs to be replaced or repaired.

The activation of the indicators 404 may be initiated by commands that are generated by functionality (e.g., program code) on one of the components 400a, 400b. Although such commands may activate an indicator 404c on a local port 402c of a component 400a that hosts the functionality, the faulty cable 408b may prevent the commands from reaching a remote port 402d on the other component 400b. That is, the commands may not be able to travel over the faulty cable 408b to the remote port 402d to activate the indicator 404d.

To address this situation, in certain embodiments, apparatus and methods in accordance with the invention may be provided to transmit commands over an alternative path. For example, if a second cable 408a connects the component 400a to the component 400b, such apparatus and methods may transmit the command over the second cable 408a, from port 402a to port 402b. Functionality within the second component 400b may receive and execute this command to activate the indicator 404d associated with the remote port 402d that is connected to the faulty cable 408b. For example, if a card 406b in the second component 400b receives the command, functionality within the second component 400b may transfer the command from the card 406b to the card 406d. The card 406d may then activate the indicator 404d on the remote port 402d, thereby identifying the faulty cable 408b. The alternative path may be a direct path between the first component 400a and the second component 400b or may pass through any number of intermediate components 400 between the first component 400a and the second component 400b.

Figure 6:
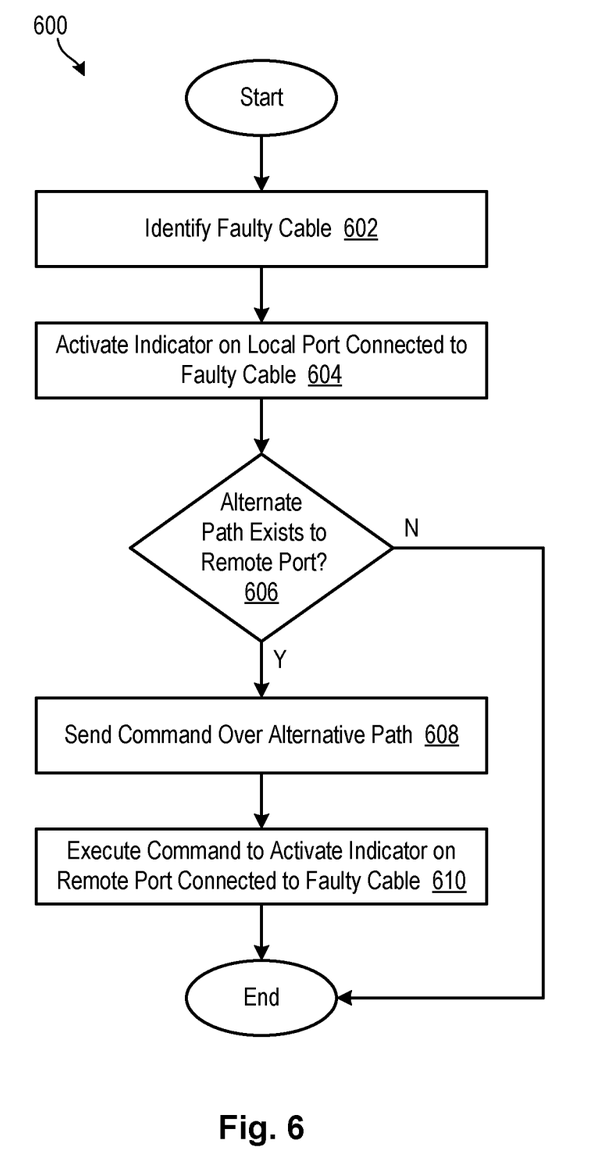
FIG. 6 is a flow diagram showing a method for activating, over an alternative path, an identifier of a remote port connected to a faulty cable.

Referring to FIG. 6, one embodiment of a method 600 is illustrated for activating, over an alternative path, an indicator 404 of a remote port 402 associated with a faulty cable 408 in an environment like that of FIG. 5. As shown, the method 600 initially identifies 602 a faulty cable 408 in the environment. For the purposes of this disclosure, a "faulty cable" may be a cable 408 that is broken, disconnected, malfunctioning, or the like. Once the faulty cable 408 is identified 602, the method 600 activates 604 an indicator 404 on a local port 402 that is connected to or associated with the faulty cable 408.

Because the cable 408 is faulty, the cable 408 may be unable to transmit a command to a remote port 402 to activate an indicator 404 thereon. Thus, the method 600 determines 606 whether an alternative path exists to the remote port 402. In certain embodiments, this alternative path is another cable 408. If such an alternative path exists, the method 600 sends 608 a command over the alternative path. This command may be received and executed 610 to activate the indicator 404 on the remote port 402.

Figure 7:
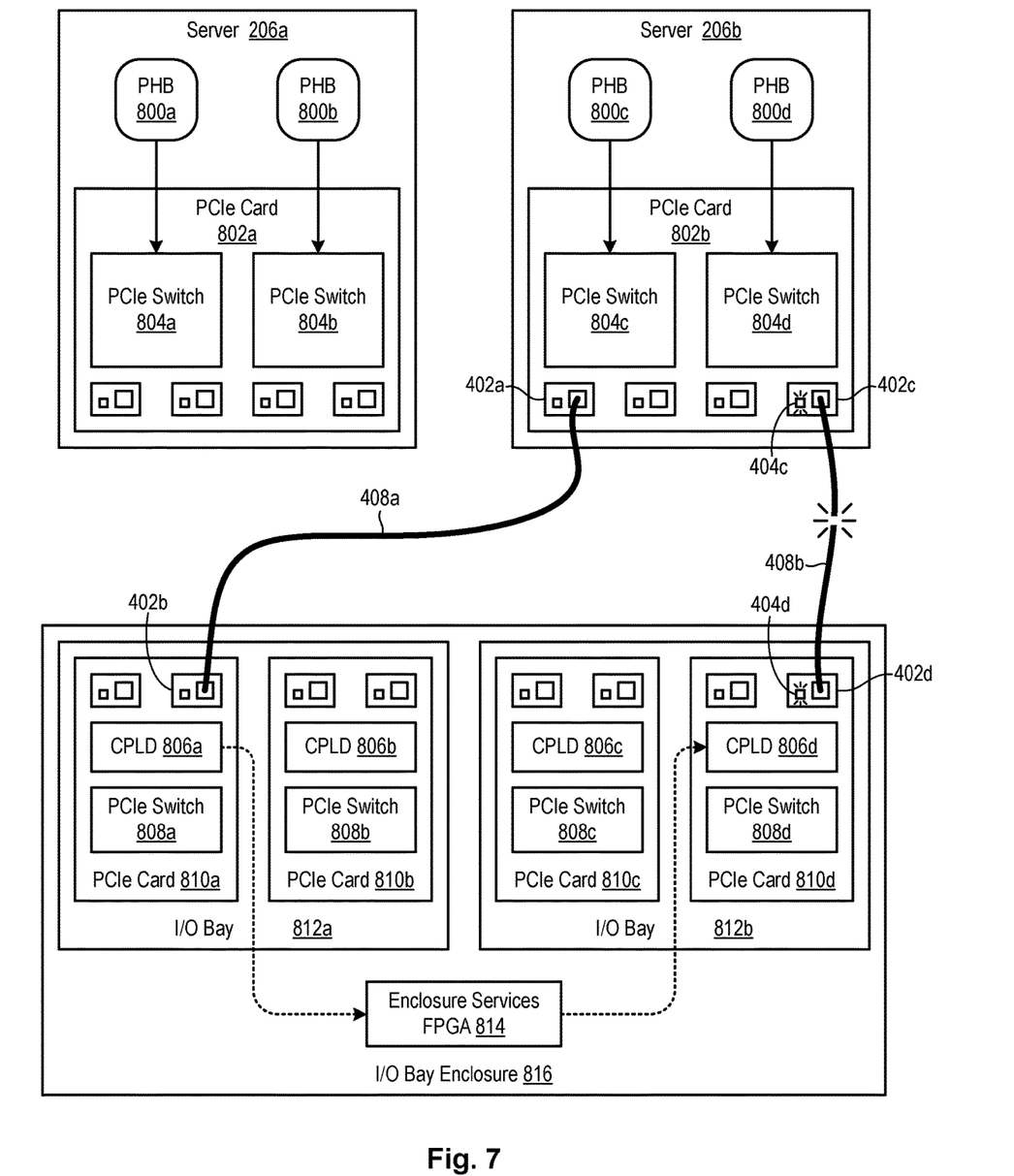
FIG. 7 is a high-level block diagram showing a faulty cable in a specific storage system implementation, as well as communication flowing through an alternative path (i.e., another good cable) to activate an identifier on a remote port connected to a faulty cable.

Referring to FIG. 7, a high-level block diagram is presented showing a faulty cable 408b in a specific DS8000™ implementation, as well as communication flowing through an alternative path (i.e., another cable 408a) to activate a indicator 404d on a remote port 402d connected to the faulty cable 408b. The illustrated implementation shows an exemplary environment where apparatus and methods in accordance with the invention may be implemented. As previously explained, an IBM DS8000™ enterprise storage system may include a pair of servers 206a, 206b to provide redundancy and ensure that data is always available to connected host systems 106. In certain embodiments, one or more PCIe (peripheral component interconnect express) cards 802a, 802b may be installed in these servers 206a, 206b to enable communication with other components, such as I/O bay enclosures 816 (such as the I/O bay enclosure 300c illustrated in FIG. 3). These PCIe cards 802a, 802b may contain PCIe switches 804a-d that interface with primary host busses 800a-d within the servers 206a, 206b. These primary host busses 800a-d may communicate with processor complexes within the servers 206a, 206b. As shown, each PCIe card 802 includes multiple ports 402 for communicating with other components, such as the illustrated I/O bay enclosure 816.

As shown, the I/O bay enclosure 816 includes multiple I/O bays 812a, 812b, each of which may include multiple PCIe cards 810a-d. In the illustrated embodiment, each PCIe card 810 contains a PCIe switch 808 as well as a CPLD 806 (complex programmable logic device) to perform low-level functions, such as turn on port indicators 404 on the PCIe cards 810.

In the event a cable 408b fails, functionality in the servers 206a, 206b may activate an indicator 404c (e.g., turn on an LED 404c) that identifies a local port 402c that is coupled to the faulty cable 408b. However, because the cable 408b is faulty, the functionality may be unable to send a command to the PCIe card 810d over the faulty cable 408b to instruct the PCIe card 810d to turn on its indicator 404d. In such cases, the functionality on the server 206b may look for an alternative path to send the command to the PCIe card 810d. For example, the functionality may identify the alternative path (i.e., cable 408a) and send the command over the alternative path. This command may identify the I/O bay 812, PCIe card 810d, port 402d, and/or indicator 404d that needs to be turned on. In this example, the command would be received by a PCIe card 810a and more particularly the CPLD 806a within the PCIe card 810a. The CPLD 806a would, in turn, communicate the command to an enclosure services FPGA (field programmable gate array) 814 within the I/O bay enclosure 816. The enclosure services FPGA 814 would then send the command to the corresponding PCIe card 810d and more particularly the CPLD 806d on the PCIe card 810d. The CPLD 806d would then turn on the indicator 404d associated with the remote port 402d, thereby identifying the cable 408b that needs to be repaired or replaced.

Figure 8:
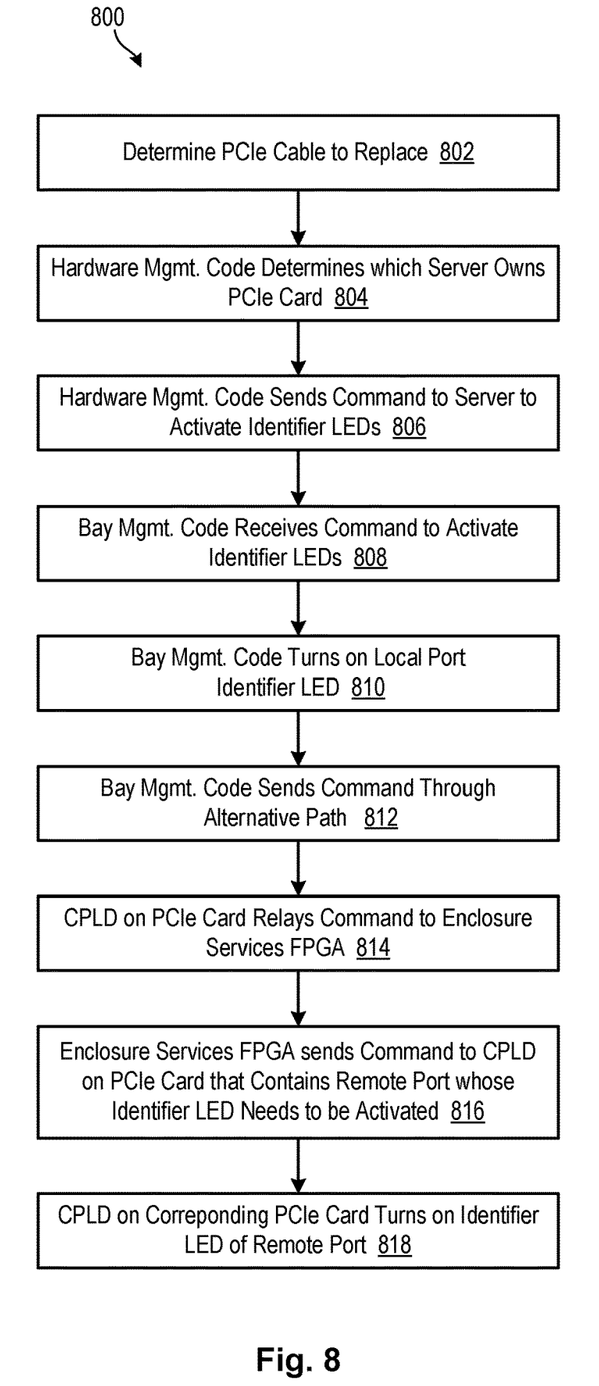
FIG. 8 is a flow diagram showing a method for activating, over an alternative path, an identifier of a remote port associated with a faulty cable in an environment such as that illustrated in FIG. 7.

Referring to FIG. 8, one embodiment of a method 800 is illustrated for activating an indicator 404d over an alternative path 408. This indicator 404d may be associated with a remote port 402d in an environment such as that illustrated in FIG. 7. As shown, the method 600 initially determines 802 a PCIe cable 408b to replace. In certain embodiments, a technician may identify the PCIe cable 408b by way of a hardware management console (HMC) coupled to a storage system 110. Hardware management code running in the hardware management console may determine 804 which server 206b in the storage system 110 owns the PCIe cards 802b, 810d that are associated with the faulty PCIe cable 408b.

At this point, the hardware management code may send a command to the server 206 to activate the indicators 404c, 404d (e.g., LEDs) on the ports 402c, 402d to which the faulty cable 408b is connected. Bay management code within the server 206b may receive 808 the command and activate 810 (i.e., turn on) the local indicator 404c. Because the cable 408b is not functioning, the bay management code may send 812 a command over an alternative path 408a to activate a remote indicator 404d. This command may identify the I/O bay 812, PCIe card 810d, port 402d, and/or indicator 404d that needs to be turned on.

A CPLD 806a on the receiving PCIe card 810a may receive and relay 814 the command to an enclosure services FPGA 814 within the I/O bay enclosure 816. The enclosure services FPGA 814 then sends 816 the command to the corresponding CPLD 806d on the PCIe card 810d that hosts the remote port 402d whose indicator 404d needs to be activated. The CPLD 806*d* turns on 818 the indicator 404*d* associated with the port 402*d* in order to identify the cable 408*b* that needs to be repaired or replaced.

The flowcharts and/or block diagrams in the Figures illustrate the architecture, functionality, and operation of possible implementations of systems, methods, and computer-usable media according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The invention claimed is:

1. A method to identify a port that is associated with a faulty cable, the method comprising:
   identifying a first cable to replace, the first cable providing a path between a first port and a second port, the first port residing on a first component and the second port residing on a second component;
   identifying whether an alternative path exists between the first component and the second component, the alternative path bypassing the first cable;
   in the event the alternative path exists, sending, over the alternative path, from the first component to the second component, a command to activate an indicator on the second port; and
   receiving, by the second component, the command and executing the command to activate the indicator.

2. The method of claim 1, wherein the alternative path extends between a third port on the first component and a fourth port on the second component.

3. The method of claim 1, wherein the alternative path is provided by a second cable.

4. The method of claim 1, wherein the indicator is a light associated with the second port.

5. The method of claim 1, wherein the first component is a processor complex.

6. The method of claim 5, wherein the second component is an I/O enclosure.

7. The method of claim 1, further comprising activating an indicator on the first port.

8. A computer program product to identify a port that is associated with a faulty cable, the computer program product comprising a computer-readable medium having computer-usable program code embodied therein, the computer-usable program code configured to perform the following when executed by at least one processor:
   identify a first cable to replace, the first cable providing a path between a first port and a second port, the first port residing on a first component and the second port residing on a second component;
   identify whether an alternative path exists between the first component and the second component, the alternative path bypassing the first cable;
   in the event the alternative path exists, send, over the alternative path, from the first component to the second component, a command to activate an indicator on the second port; and
   receive, by the second component, the command and execute the command to activate the indicator.

9. The computer program product of claim 8, wherein the alternative path extends between a third port on the first component and a fourth port on the second component.

10. The computer program product of claim 8, wherein the alternative path is provided by a second cable.

11. The computer program product of claim 8, wherein the indicator is a light associated with the second port.

12. The computer program product of claim 8, wherein the first component is a processor complex.

13. The computer program product of claim 12, wherein the second component is an I/O enclosure.

14. The computer program product of claim 8, wherein the computer-usable program code is further configured to activate an indicator on the first port.

15. An apparatus to identify a port that is associated with a faulty cable, the apparatus comprising:
   at least one processor;
   at least one memory device coupled to the at least one processor and storing instructions for execution on the at least one processor, the instructions causing the at least one processor to:
      identify a first cable to replace, the first cable providing a path between a first port and a second port, the first port residing on a first component and the second port residing on a second component;
      identify whether an alternative path exists between the first component and the second component, the alternative path bypassing the first cable;
      in the event the alternative path exists, send, over the alternative path, from the first component to the second component, a command to activate an indicator on the second port; and
      receive, by the second component, the command and execute the command to activate the indicator.

16. The apparatus of claim 15, wherein the alternative path extends between a third port on the first component and a fourth port on the second component.

17. The apparatus of claim 15, wherein the alternative path is provided by a second cable.

18. The apparatus of claim 15, wherein the indicator is a light associated with the second port.

19. The apparatus of claim 15, wherein the first component is a processor complex.

20. The apparatus of claim 19, wherein the second component is an I/O enclosure.

* * * * *